United States Patent [19]

Christenson et al.

[11] Patent Number: 4,749,441
[45] Date of Patent: Jun. 7, 1988

[54] SEMICONDUCTOR MUSHROOM STRUCTURE FABRICATION

[75] Inventors: John C. Christenson; Peter J. Schubert, both of Kokomo, Ind.

[73] Assignee: General Motors Corporation, Detroit, Mich.

[21] Appl. No.: 940,436

[22] Filed: Dec. 11, 1986

[51] Int. Cl.[4] .................... H01L 21/20; C30B 29/60
[52] U.S. Cl. .................................. 156/644; 437/89; 437/90; 437/249; 156/612; 156/657
[58] Field of Search ............... 156/611, 612, 643, 644, 156/648, 657; 29/576 E, 578, 580; 148/175; 437/89–92, 249

[56] References Cited

U.S. PATENT DOCUMENTS

| Re. 31,580 | 5/1984 | Kooi | 357/23 |
|---|---|---|---|
| 3,432,920 | 3/1969 | Rosenzweig | 29/578 |
| 3,544,858 | 12/1970 | Kooi | 317/235 |
| 3,574,008 | 4/1971 | Rice | 148/175 |
| 3,958,040 | 5/1976 | Webb | 437/228 |
| 4,178,197 | 12/1979 | Marinace | 437/89 |
| 4,333,965 | 6/1982 | Chow et al. | 437/228 |
| 4,384,301 | 5/1983 | Tasch | 357/23 |
| 4,400,411 | 8/1983 | Yuan et al. | 156/612 X |
| 4,507,158 | 3/1985 | Kamins et al. | 148/175 |
| 4,522,662 | 6/1985 | Bradbury et al. | 148/175 |
| 4,522,682 | 7/1985 | Soclof | 156/647 |
| 4,533,431 | 8/1985 | Dargent | 156/643 |
| 4,551,394 | 11/1985 | Betsch et al. | 148/175 X |
| 4,578,142 | 3/1986 | Corboy et al. | 156/612 |
| 4,637,127 | 1/1987 | Kurogi et al. | 29/576 E |

FOREIGN PATENT DOCUMENTS 81104511.1 12/1981 European Pat. Off. .

Primary Examiner—S. Leon Bashore
Assistant Examiner—Andrew J. Anderson
Attorney, Agent, or Firm—Domenica N. S. Hartman

[57] ABSTRACT

A method of fabricating single crystal silicon in a "mushroom" shape for use in fabricating devices such as a Silicon-On-Insulator-Like MOSFET. One embodiment of the inventive method entails fabricating a hole-within-a-hole structure in a thick silicon dioxide layer disposed on a single crystal silicon substrate, growing single crystal silicon in the inner hole, etching back the silicon dioxide layer to expose a portion of the silicon in the inner hole, and growing single crystal silicon by selective epitaxial growth in the outer hole.

20 Claims, 2 Drawing Sheets

SEMICONDUCTOR MUSHROOM STRUCTURE FABRICATION

This invention relates to a method for fabricating structures in semiconductor materials, and in particular, to a method for fabricating structures used in integrated circuits.

CROSS REFERENCE

This application is related to three other applications, U.S. Ser. No. 939,183, now U.S. Pat. No. 4,714,685, Ser. No. 940,255 now U.S. Pat. Nos. 4,716,128, and 939,078 which are being filed concurrently with the present application and in which there is one common inventor and a common assignee.

BACKGROUND OF THE INVENTION

The semiconductor industry is increasing its use of integrated circuits. In particular, there is a demand for silicon-on-insulator structures comprising a "mushroom" shape, i.e., a relatively narrow "stem" of silicon grown through an oxide layer and having a silicon "head," of larger lateral dimension than the "stem," grown on top of the stem in such a manner that a portion of the "head" is positioned on top of the oxide layer. Such a structure is shown in European patent application No. 81104511.1, filed 11.06.81.

When the "mushroom" shape is formed by growing silicon, first vertically and then laterally over a step in the oxide layer, the silicon grown over the step has a tendency to become polycrystalline. As a result, devices such as a Silicon-On-Insulator-Like (SOIL) insulated gate field effect transistor (IGFET) fabricated in this manner may have degraded performance.

As a result, it is desirable to have a method for reliably growing a monocrystalline (single crystal) semiconductor, and in particular, single crystal silicon in a "mushroom" shape.

SUMMARY OF THE INVENTION

The present invention is directed to a method for reliably fabricating a single crystal semiconductor material in a "mushroom" shape. One embodiment of the present invention comprises the steps of: (a) forming a first hole in a layer disposed on a substrate, the first hole not extending through the layer to the substrate; (b) forming a second hole within the first hole, the second hole extending through the layer to the substrate; (c) forming a semiconductor material within the second hole; (d) removing a portion of the layer to expose a portion of the semiconductor material disposed in the second hole; and (e) forming the semiconductor material in the first hole.

Another embodiment of the present invention comprises the steps of: (a) forming a first hole in a layer disposed on a substrate, the first hole extending through the layer to the substrate; (b) forming a second hole encircling the first hole, the second hole not extending through the layer to the substrate; (c) forming a semiconductor material within the first hole; (d) removing a portion of the layer to expose a portion of the semiconductor material disposed in the first hole; and (e) forming the semiconductor material in the second hole.

Yet another embodiment of the present invention comprises the steps of: (a) forming a first hole in a layer disposed on a substrate, the first hole extending through the layer to the substrate; (b) forming a semiconductor material within the first hole; (c) forming a second hole surrounding the first hole, the second hole not extending through the layer to the substrate but extending far enough through the layer to expose a portion the semiconductor material disposed in the first hole; and (e) forming the semiconductor material in the second hole.

The present invention may be applied to II-VI and III-V based semiconductors as well as to silicon based semiconductors.

In a preferred embodiment of the present invention for use in forming a single crystal silicon "mushroom" shape structure, the steps of forming semiconductor material comprise growing single crystal silicon by selective epitaxial growth. Single crystal silicon is grown because the exposed silicon serves as a single crystal lattice site for the selective epitaxial growth process. As a result, the crystallinity of the exposed silicon is extended to form "device-quality" single crystal silicon in the larger hole.

The "mushroom" shaped single crystal silicon structure formed in accordance with the inventive method can be used to fabricate a device such as a Silicon-On-Insulator-Like (SOIL) IGFET.

The present invention is better understood by considering the following detailed description taken in conjunction with the accompanying drawings.

Figure 1:
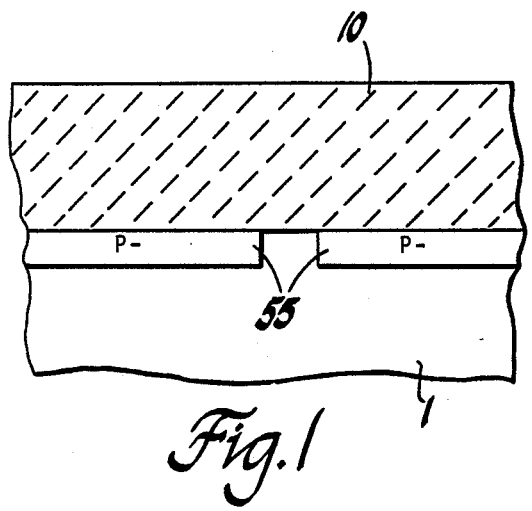
FIGS. 1-3 show cross-sectional views of structures at various stages in the fabrication of a hole-with-a-hole in accordance with the method of the present invention.

It is to be noted that the drawings are not to scale since the vertical dimensions generally are much smaller than the horizontal dimensions.

Moreover, although the method will be used to process a semiconductor substrate (chip) in which a large number of structures will be formed in one sequence of steps, the drawing and the description are generally limited to the fabrication of a single structure.

To facilitate understanding, identical reference numerals are used to designate elements common to the figures.

DETAILED DESCRIPTION

FIG. 1 shows a cross-sectional view of a structure which comprises semiconductor body (substrate) 1 and thick silicon dioxide layer 10. Substrate 1 is typically single crystal silicon having a high resistivity and having a dopant concentration of about $10^{15}$ atoms/cubic centimeter and may be of p or n type conductivity. In the specific example being described, it will be assumed that the doping of substrate 1 is p-type, as is characteristic of the more widely used n-channel MOS transistor, and that it is formed from (100) single crystal silicon. Before silicon dioxide layer 10 was formed, substrate 1 was masked and an ion implant of p-type impurities, for example, boron, was selectively carried out to heavily dope (to approximately $1 \times 10^{18}$ to $1 \times 10^{19}$ atoms/cubic centimeter) the portions 55 of body 10. This implant is used to increase the electrical isolation between transistors by preventing inversion of such portions as is known in the art and is typically denoted as a field or channel stop implant. Next, relatively thick silicon dioxide layer 10, for example, 0.6 to 1.0 microns, was grown, for example, by exposing the substrate to a steam ambient for two hours at 1100° C., or was deposited thereon by chemical vapor deposition (CVD). Typically, hundreds or thousands or ten thousands of transistors and other devices will be formed on substrate 1. However, for the sake of convenience the fabrication of a single "mushroom" shape structure will be illustrated.

Figure 2:
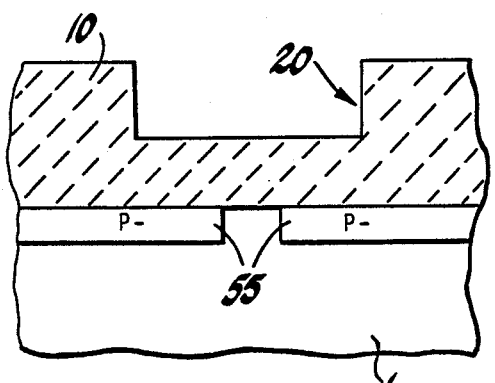

FIG. 2 shows a cross-sectional view of a structure fabricated from the structure shown in FIG. 1 by applying a photoresist mask layer to silicon dioxide layer 10 using well known photolithographic masking techniques and then etching large hole 20 partially through silicon dioxide layer 10. It is preferable to use an anisotropic etch such as a plasma etch, which is well known in the art, rather than a wet etch for this step in order to avoid undercutting.

Figure 3:
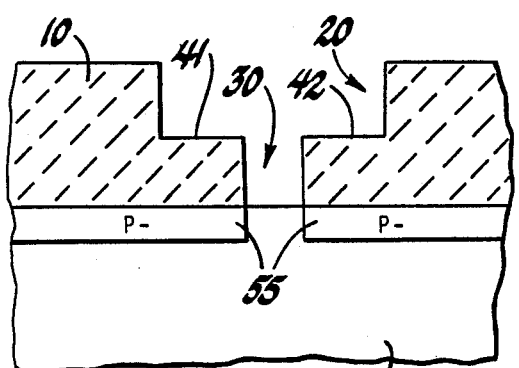

FIG. 3 shows a cross-sectional view of a structure fabricated from the structure shown in FIG. 2 by applying a second photoresist mask layer to silicon dioxide layer 10 and then etching small hole 30 by plasma and/or wet etching, straight through silicon dioxide layer 10 to expose substrate 1. Literature information indicates that poorer quality epitaxial deposits are made on silicon exposed by plasma etching. Hence, etching started in plasma and finished in a wet etchant may be preferred. It will be recognized by those skilled in the art that the lateral edges of larger hole 20 may be sloped as a result of the etch process used in its fabrication.

Figure 4:
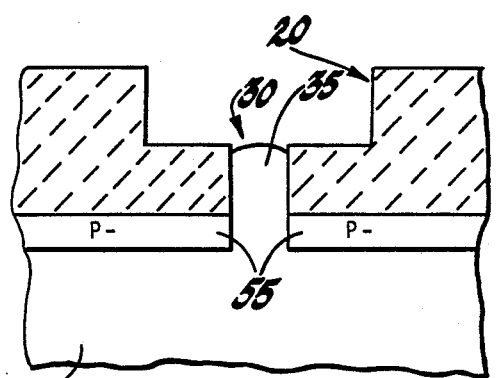
FIGS. 4-6 show cross-sectional views of structures at various stages in the fabrication of a single crystal silicon structure having a "mushroom" shape in accordance with the method of the present invention.

FIG. 4 shows a cross-sectional view of a structure fabricated from the structure shown in FIG. 3 by using selective epitaxial growth to substantially fill smaller hole 30 with single crystal silicon seeded from the exposed silicon of substrate 1. The silicon growth is shown in FIG. 4 to extend to the top of smaller hole 30 although this is not required. Selective epitaxial growth comprises a conventional silicon epitaxial growth step at a high temperature, for example, 1050° C., in an HCl gas ambient. As a result of selective epitaxial growth, silicon only grows on silicon and not on silicon dioxide. If necessary it is feasible to improve the crystalline nature of the silicon by subsequent heat treatment, such as laser anneal or other anneal.

Figure 5:
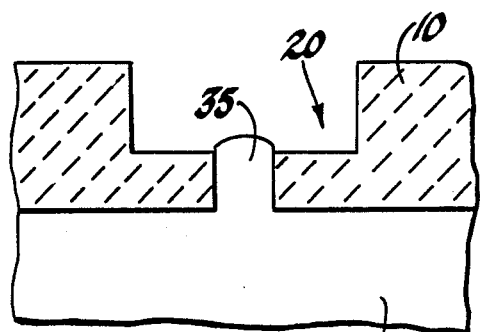

FIG. 5 shows a cross-sectional view of a structure fabricated from the structure shown in FIG. 4 by applying a blanket, partial silicon dioxide etch to expose a small amount of single crystal silicon 35 in larger hole 20 by using etch methods well known in the art, for example, a wet etch comprising a 10:1 mixture of H2O:HF for approximately one-half minute. The effect of this exposure is to place a seed of single crystal silicon within the volume of larger hole 20. In FIG. 5 and subsequent figures, p-type field implant 55 is excluded so that one may better appreciate the essential features of the present invention.

Figure 6:
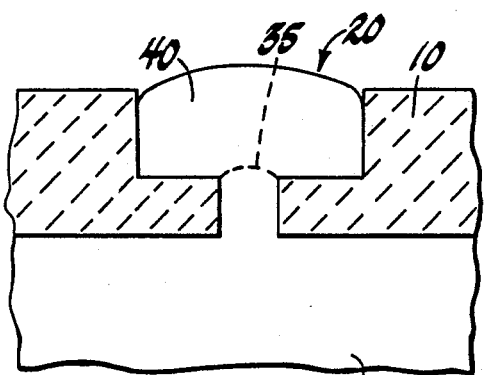

FIG. 6 shows a cross-sectional view of a structure fabricated from the structure shown in FIG. 5 by using selective epitaxial growth to substantially fill larger hole 20 with single crystal silicon seeded from exposed single crystal silicon 35. The silicon which fills larger hole 20 grows outward from seed crystal, exposed silicon 35. Again, if necessary it is feasible to improve the crystalline nature by subsequent anneal as is known in the art. It should be recognized that it is not necessary to fill larger hole 20 because one may, depending on the particular application, merely etch away part of silicon dioxide layer 10 to the desired height or so that silicon appears at the top of layer 10 after the etch.

The remainder of the figures show the various steps required to fabricate a simple IGFET structure using the structure fabricated in accordance with the present invention.

Figure 7:
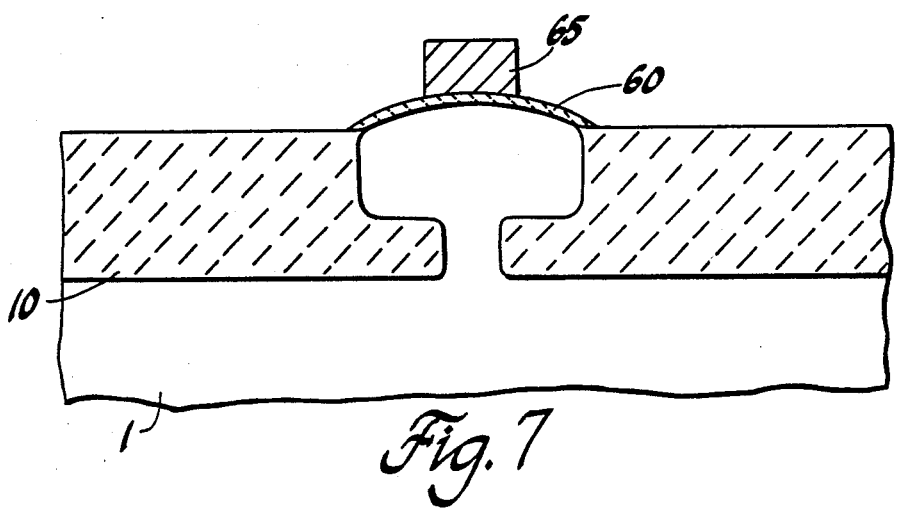
FIGS. 7-9 show cross-sectional views of structures at various stages in the fabrication of a SOIL MOSFET in accordance with the method of the present invention.

FIG. 7 shows a cross-sectional view of a structure fabricated from the structure shown in FIG. 6 by: (1) growing silicon dioxide layer 60 thereover by means well known in the art, for example, by means of a high temperature oxidation at 1100° C.; (2) then performing a light-dose, threshold implant with appropriate impurities by means well known in the art with, for example, $5 \times 10^{11}$ impurities/cm$^2$ to establish a gate threshold voltage in a known fashion if such adjustment is desired; (3) then depositing and heavily doping a polysilicon layer suitable for use as the gate region (electrode) of the transistor over the resulting structure by means well known in the art and doping it with phosphorus by means well known in the art to obtain a low resistance; (4) then applying a photolithographic mask; and (5) then plasma etching the polysilicon layer to provide polysilicon gate 65 of the desired dimensions for the gate region (electrode) over the central portion of the top surface.

Figure 8:
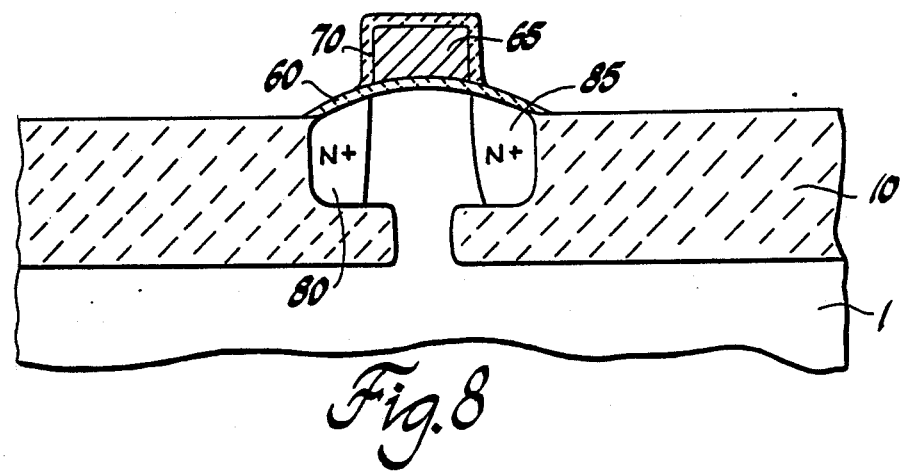

FIG. 8 shows a cross-sectional view of a structure fabricated from the structure shown in FIG. 7 by (1) applying thin layer 70 of silicon dioxide to the structure by well known methods, for example, by heating in an oxidizing ambient to lightly oxidize the exposed surfaces of polycrystalline gate 65 as a protective layer before subjecting the structure in a known fashion to high dosage implants of n-type donor ions to doped regions 80 and 85, not covered by polysilicon gate 65, so that they can serve as the source and drain, respectively, of the n-channel IGFET being formed; (2) masking and ion implanting source and drain regions 80 and 85, respectively, with a high dose n-type implant such as phosphorus at, for example, $5 \times 10^{15}$ impurities/cm$^2$ to provide dopant concentrations of approximately $1 \times 10^{19}$ to $1 \times 10^{20}$ atoms/cubic centimeter; and (3) chemically vapor deposit silicon dioxide, and (4) annealing the structure to activate the dopant and to densify the CVD silicon dioxide.

There remains to provide desired electrical connections to the source, drain and gate regions to permit connection of the transistor into an integrated circuit.

Figure 9:
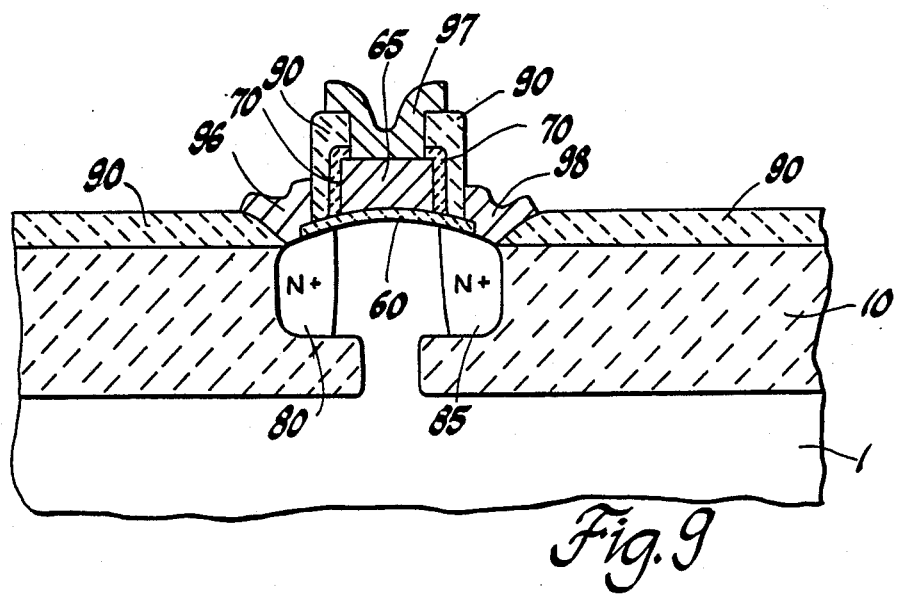

FIG. 9 shows a cross-sectional view of a structure fabricated from the structure shown in FIG. 8 by (1) applying approximately 0.5 micron thick, conformal CVD silicon dioxide layer 90 containing approximately 5% to 7% phosphorus over the structure as a protective barrier; (2) then masking and etching contact holes for n+ source and drain regions 80 and 85 and polysilicon gate 65 using methods well known in the art; (3) then depositing a layer of contact metal, typically an aluminum-silicon alloy, over silicon dioxide layer 90 to fill the via openings; and (4) finally patterning and etching the metal to form contacts 96, 97 and 98 and to provide a desired interconnection pattern between transistors as needed for an integrated circuit. Note that in some instances, two or more levels of metalization may be needed.

In the finished device shown in FIG. 9, source and drain regions 80 and 85, respectively, are encapsulated on all sides but the one facing the channel. Thus, this device is referred to as a Silicon-On-Insulator-Like (SOIL) IGFET.

The embodiments described herein are intended to be illustrative of the general principles of the invention. Various modifications are possible consistent with the spirit of the invention. For example, instead of first making the larger hole and then the smaller one, the order can be reversed so that the smaller hole is made first followed by the larger hole. In another example, the smaller hole can be made first, silicon can then be fabricated therein and the larger hole can be made, having a sufficient depth in the layer to expose the silicon formed in the smaller hole. Additionally, a variety of known techniques are available for each of the steps of the method which are consistent with the invention. Furthermore, although the above-described invention is described in the context of growing a silicon "mushroom" shape in connection with a silicon dioxide layer disposed on a silicon substrate, it is not confined to use with these materials. In fact, the present invention has application to III-V compounds such as structures formed using GaAs and ternary and quaternary III-V semiconductor compounds such as AlGaAs and InGaAsP with the process modified to be consistent with the processing requirements of these materials. For example, the "mushroom" shape may comprise GaAs grown on a CVD SiN layer. It should also be recognized that the product of this invention provides a high degree of surface planarity, as compared to other selective epitaxial deposition techniques.

The embodiments of the invention in which an exclusive property or privilege is claimed are defined as follows:

1. A method for fabricating a "mushroom" structure which comprises the steps of:
   forming a first hole in a layer disposed on a substrate, the first hole not extending through the layer;
   forming a second hole within the first hole, the second hole extending through the layer to the substrate;
   forming semiconductor material in the second hole;
   etching the layer to expose a portion of the semiconductor material disposed in the second hole; and
   forming semiconductor material in the first hole.

2. The method of claim 1 wherein:
   the step of forming semiconductor material in the second hole comprises vertically growing semiconductor material extending from the substrate; and
   the step of forming semiconductor material in the first hole comprises forming semiconductor material extending from the exposed portion.

3. The method of claim 2 wherein the semiconductor material is silicon, the layer is silicon dioxide and the step of forming semiconductor material in the second hole comprises selective epitaxial growth.

4. The method of claim 2 wherein the semiconductor material is silicon, the layer is silicon dioxide and the step of forming semiconductor material in the second hole comprises the step of forming substantially single crystal silicon.

5. The method of claim 4 wherein the step of forming semiconductor material in the first hole comprises selective epitaxial growth to substantially fill the first hole.

6. The method of claim 4 wherein the step of forming semiconductor material in the first hole comprises substantially filling the first hole with substantially single crystal silicon.

7. The method of claim 2 wherein the semiconductor material is a III-V compound.

8. The method of claim 7 wherein the III-V compound is GaAs.

9. A method for fabricating a "mushroom" structure which comprises the steps of:
   forming a first hole in a layer disposed on a substrate, the first hole extending through the layer to the substrate;
   forming a second hole in the layer, surrounding the first hole, the second hole not extending through the layer;
   forming semiconductor material in the first hole;
   removing a portion of the layer to expose a portion of the semiconductor material disposed in the first hole; and
   forming semiconductor material in the second hole.

10. The method of claim 9 wherein:
    the step of forming semiconductor material in the first hole comprises vertically growing semiconductor material extending from the substrate; and
    the step of forming semiconductor material in the second hole comprises forming semiconductor material extending from the exposed portion.

11. The method of claim 10 wherein the semiconductor material is silicon, the layer is silicon dioxide and the step of forming semiconductor material in the first hole comprises selective epitaxial growth.

12. The method of claim 10 wherein the semiconductor material is silicon, the layer is silicon dioxide and the step of forming semiconductor material in the first hole comprises the step of forming substantially single crystal silicon.

13. The method of claim 12 wherein the step of forming semiconductor material in the second hole comprises selective epitaxial growth to substantially fill the second hole.

14. The method of claim 12 wherein the step of forming semiconductor material in the second hole comprises substantially filling the second hole with substantially single crystal silicon.

15. A method for fabricating a "mushroom" structure which comprises the steps of:
    forming a first hole in a layer disposed on a substrate, the first hole extending through the layer; forming semiconductor material in the first hole;
    forming a second hole in the layer surrounding the first hole, the second hole extending through the layer to expose a portion of the semiconductor material disposed in the first hole; and
    forming semiconductor material in the second hole.

16. The method of claim 15 wherein:
    the step of forming semiconductor material in the first hole comprises vertically growing semiconductor material extending from the substrate; and
    the step of forming semiconductor material in the second hole comprises forming semiconductor material extending from the exposed portion.

17. The method of claim 16 wherein the semiconductor material is silicon, the layer is silicon dioxide and the step of forming semiconductor material in the first hole comprises selective epitaxial growth.

18. The method of claim 16 wherein the semiconductor material is silicon, the layer is silicon dioxide and the step of forming semiconductor material in the first hole comprises the step of forming substantially single crystal silicon.

19. The method of claim 18 wherein the step of forming semiconductor material in the second hole comprises selective epitaxial growth to substantially fill the second hole.

20. The method claim 18 wherein the step of forming semiconductor material in the second hole comprises substantially filling the second hole with substantially single crystal silicon.

* * * * *